United States Patent [19]

Kub

[11] Patent Number: 4,594,604

[45] Date of Patent: Jun. 10, 1986

[54] CHARGE COUPLED DEVICE WITH STRUCTURES FOR FORWARD SCUPPERING TO REDUCE NOISE

[75] Inventor: Francis J. Kub, Pasadena, Md.

[73] Assignee: Westinghouse Electric Corp., Pittsburgh, Pa.

[21] Appl. No.: 544,168

[22] Filed: Oct. 21, 1983

[51] Int. Cl.⁴ .................. H01L 29/78; H01L 27/14; H01L 31/00; G11C 19/28
[52] U.S. Cl. ........................ 357/24; 357/30; 357/43; 377/60
[58] Field of Search ............... 357/24, 30, 43; 377/57–63

[56] References Cited

U.S. PATENT DOCUMENTS 4,488,163 12/1984 Bluzer et al. ................ 357/24

FOREIGN PATENT DOCUMENTS 1557238 12/1979 United Kingdom ............. 357/24

OTHER PUBLICATIONS

Chamberlain, "High Speed Scanner Photoelement with Gain", IBM Tech. Disclosure Bulletin, vol. 19 (4/77), pp. 4458-4460.

Primary Examiner—Gene M. Munson
Attorney, Agent, or Firm—W. G. Sutcliff

[57] ABSTRACT

A charge coupled device incorporates a P+ region which may be forward biased with respect to the channel to provide PNP transistor action with the channel acting as the base region at first times and at other times the P+ region is reverse biased, permitting charge to flow in the channel undisturbed. The invention overcomes the problem of conducting charge underneath or past an electrode or region used at times for emptying charge from the channel. Also an N+ region separated by an electrode may inject or remove carriers at selected times from the channel of a CCD to provide forward scuppering of the carriers to remove KTC noise.

25 Claims, 13 Drawing Figures

CHARGE COUPLED DEVICE WITH STRUCTURES FOR FORWARD SCUPPERING TO REDUCE NOISE

CROSS-REFERENCE TO RELATED APPLICATION

This application is cross-referenced to an application entitled "Highly Isolated Photodetectors" by N. Bluzer, A. P. Turley, F. J. Kub and G. M. Borsuk having Ser. No. 225,900, filed on Jan. 19, 1981, which issued as U.S. Pat. No. 4,488,163, which describes a photodiode in combination with a P-type substrate below which provides vertical PNP transistor action at times the PN junction of the photodiode is forward-biased, such as when high levels of radiant energy are absorbed. At other times when the PN junction is reverse-biased, the voltage across the photodiode is represented as charged in a charge coupled device. At times when the photodiode is forward-biased, the charge (holes) passing into the N region from the P region will not build up to laterally diffuse other detectors, but is transported across the N region to the P region of the substrate by transistor action.

BACKGROUND OF THE INVENTION

1. Field of the Invention:

This invention relates to charge coupled devices and more particularly to forward scuppering to reduce noise and remove offsets among a plurality of charge coupled devices.

2. Description of the Prior Art:

A variety of methods have been developed for placing a predetermined amount of charge in the channel of a charge coupled device (CCD). One such method was described in U.S. Pat. No. 4,112,456 which issued on Sept. 5, 1978 to D. R. Lampe et al., and assigned to the assignee herein entitled "Stabilized Charge Injector for Charge Coupled Devices with Means for Increasing the Speed of Propagation of Charge Carriers". In U.S. Pat. No. 4,112,456, the channel was formed by a depletion region in N-type material with a plurality of electrodes over top, insulated by a layer of silicon dioxide for transferring the charge in the channel. A P+ region was formed at one end of the channel and at times was biased for injecting charge into a holding well in the channel and at other times biased for scuppering or removing charge from the holding well over a predetermined potential barrier within the channel. A precise amount of charge was therefore placed in the holding well as a function of the potential barrier between the holding well and the P+ region. The scuppering action removed the charge at the end of the channel. It does not show or suggest, however, using the semiconductor material on the other side of the P+ region as part of the channel. The scuppering action removed the charge from a holding well in the opposite direction to the transfer of the remaining charge.

Also in the prior art, the fabrication of vertical PNP transistors is well known, comprising an emitter region at the surface, a base region having a predetermined width below the surface and a collector region, substrate, below the base region.

It is therefore desirable to provide charge equalization in a holding well of a charge coupled device where a portion of the charge is scuppered forward of the holding well rather than in the reverse direction as in most scuppering techniques.

It is further desirable that the structure within the charge coupled device that permits scuppering of charge forward of the holding well also permits charge to be transported past this portion of the charge coupled device in the channel.

It is further desirable to fabricate a vertical PNP transistor within the channel of a charge coupled device which exhibits bipolar action when the emitter junction is forward biased to remove charge in the channel and which exhibits no bipolar action at times the emitter is reverse-biased.

It is further desirable to provide a means utilizing a bipolar transistor structure incorporating the channel of a CCD device to couple minority charge from the channel and to convert the minority charge to majority charge in a conductor to provide a signal in the form of current or potential.

SUMMARY OF THE INVENTION

In accordance with the present invention, a charge coupled device having a channel is described including a P+ region in the channel, an N-type region forming the channel and a P-type region below the channel. At times when the P+ region is forward-biased, the charge (electrons) in the channel will be injected over a potential barrier into the P+ emitter region, while the majority charge (holes) in the P+ region will be injected through the channel region to the P-type region below without interaction with the charge (electrons) in the channel, thereby exhibiting PNP transistor action. At times when the P+ region is reverse-biased, majority charge (electrons) in the N-type channel is allowed to pass between the P+ region and the P-type region below undisturbed without transistor action.

The invention further provides a means for coupling charge from the channel and transferring it through the P+ region to a conductor to provide a signal in the form of current or voltage potential.

The invention further provides an additional embodiment for forward scuppering using an electrode over the channel and an N+ region. The N+ region injects carriers underneath the electrode at first times into the channel and acts as a sink at second times to attract carriers from the channel.

DESCRIPTION OF THE PREFERRED EMBODIMENT

Figure 1:
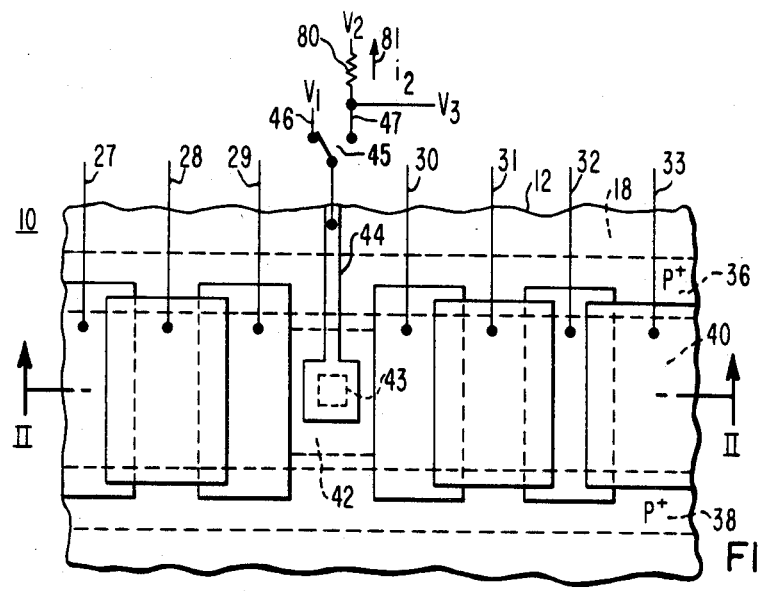
FIG. 1 is a plan view of one embodiment of the invention.
Figure 2:
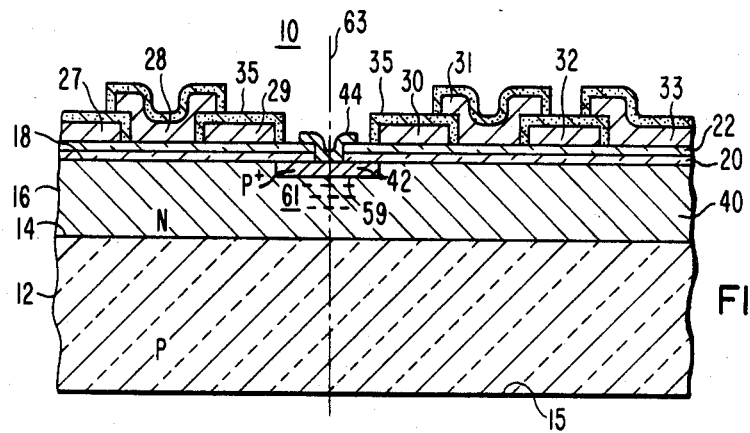
FIG. 2 is a cross-section view along the lines II—II of FIG. 1.

Referring to the drawing and in particular to FIG. 1, a charge coupled device 10 is shown. A cross-section view of FIG. 1 taken along the lines II—II is shown in FIG. 2. In FIGS. 1 and 2 a semiconductor substrate 12 which may for example be silicon has an upper surface 14. Substrate 12 may for example be a P-type substrate having an epitaxial N-type layer 16 thereover. Layer 16 has an upper surface 18 with a layer of silicon dioxide 20 and a layer of silicon nitride 22 overlying upper surface 18. N-type layer 16 may be epitaxial silicon 30,000 Angstroms thick. Silicon dioxide layer 20 may for example be 500 Angstroms thick. Silicon nitride layer 22 may for example be 1000 Angstroms thick. Above silicon nitride layer 22 are electrodes 27 through 33 which function to form depletion regions in layer 16 and potential wells within a depletion region for moving charge in layer 16. P+ regions 36 and 38 that may be diffused completely through the N-type layer 16 function to confine the charge underneath electrodes 27 to 33 in layer 16. Between regions 36 and 38 is channel 40 of charge coupled device 10 where charge is controlled.

P+ region 42 is positioned between electrodes 29 and 30 and extends for a predetermined distance into N-type layer 16. The separation between the P+ region 42 and the P+ regions 36 and 38 in FIG. 1 can be designed for two modes of operation. In one mode, the N region between regions 42 and 36 and 38 is completely depleted, establishing a potential minimum that is more repulsive than the most attractive state of the potential minimum under the clocked gate 30. Thus, when gate 30 is in its most attractive state, the carriers held in the region or channel 40 beneath and to the side of region 42 will be transported to the region beneath gate 30. In the second mode of operation, the separation between regions 42 and 36 and 38 is such that the N-type regions on the side of 42 are not completely depleted. The most desirable mode of operating the CCD when this condition applies is to apply a DC potential to gate 30 such that the potential minimum beneath gate 30 is mid-range between the most attractive and most repulsive potential. The undepleted N regions on the side of 42 will then be at the same potential as the potential minimum under gate 30. In this case, when carriers are injected from beneath gate 29 into the region near region 42 they will be held in this region until gate 31 goes attractive and then transport to the region beneath gate 31. An opening 43 in silicon dioxide layer 20 and silicon nitride layer 22 permits conductive electrode 44 to be in ohmic contact with P+ region 42. Conductive electrode 44 is coupled through single pole, double throw switch 45. Switch 45 couples conductive electrode 44 to line 46 and voltage potential $V_1$ or to line 47 and voltage potential $V_2$.

Figure 3:
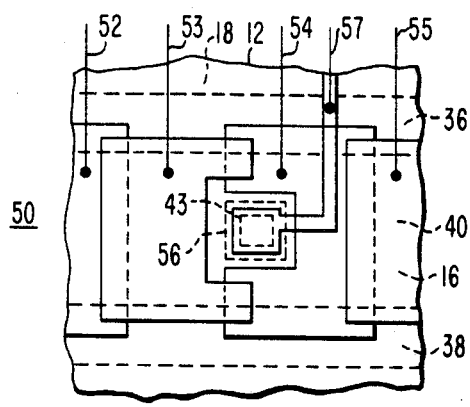
FIG. 3 is a plan view of an alternate embodiment of the invention.

FIG. 3 shows an alternate embodiment of the invention. In FIG. 3, like references are used for functions corresponding to the apparatus of FIG. 1. Electrodes 52-55, which may be metal or polysilicon, function to form holding wells or to move charge in channel 40 by applying appropriate potentials to the electrodes. A P+ region 56 is formed in N-type layer 16 to a predetermined depth. Opening 43 functions to permit ohmic contact between electrode or conductor 57 and region 56. Electrodes 52-55 have appropriate insulation to insulate one from another. As can be seen in FIG. 3, P+ region 56 is between electrodes 53 and 54 and could be interior of electrode 54 so as not to require additional space in charge coupled device 50. P+ region 56 therefore could be between electrodes 53 and 54 or interior of either electrode 53 or 54 or within an indented edge of either electrode 53 or 54. It is noted that the function of electrodes 53 and 54 is to establish potential wells or potential regions in channel 40 for the purpose of holding or moving charge from underneath one electrode to underneath the other and vice versa.

In operation of the invention as shown in FIG. 1, conductive electrode 44 is coupled through switch 45 to voltage supply $V_1$ which has a sufficient voltage to place the PN junction 59 between P+ region 42 and N-type layer 16 in the reverse-biased condition and non-conducting. Electrons 61 may pass from underneath electrode 29 to underneath electrode 30 if the depletion channel below electrode 30 is more attractive than the region in the channel below electrode 29. Electrons 61 will be undisturbed by PN junction 59 which will be reverse-biased. FIG. 2 shows electrons 61 in the channel below P+ region 42.

Figure 4:
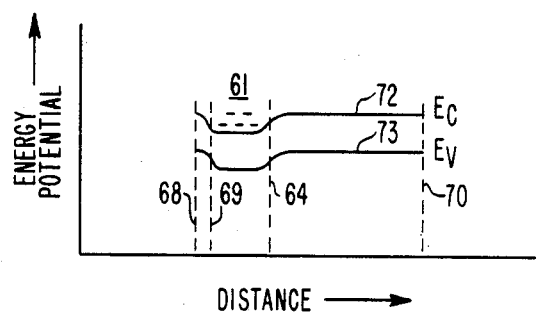
FIGS. 4 and 5 are graphs showing the energy potential along the reference line 63 of FIG. 2.
Figure 5:
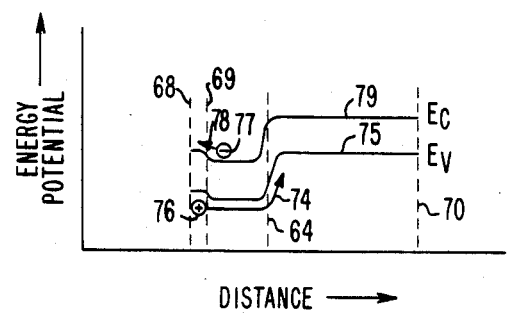

FIG. 4 is a graph showing the energy level of electrons with respect to P+ region 42, N-type layer 16 and P-type substrate 12 as a function of distance along reference line 63 shown in FIG. 2. In FIG. 4, reference line 68 corresponds to upper surface 18 at the position of reference line 63 shown in FIG. 2. In FIG. 4, reference line 69 corresponds to PN junction 59 at the position of reference line 63. Reference line 64 corresponds to the position of upper surface 14 with reference line 63. Reference line 70 corresponds to the position of lower surface 15 of substrate 12 with reference line 63. In FIGS. 4 and 5, the ordinate represents energy level and the abscissa represents distance along reference line 63. Thus, the region between reference lines 68 and 69 in FIGS. 4 and 5 corresponds to P+ region 42 along reference line 63. The region between reference lines 69 and 64 corresponds to the layer 16 along reference line 63. The region between reference line 64 and reference line 70 corresponds to substrate 12 along reference line 63.

Curve 72 shows the energy level of the conduction band, $E_C$, along reference line 63 shown in FIG. 2. Curve 73 shows the energy level of the valance band, $E_V$, along reference line 63. In FIG. 4, electrons 61 are shown above the conduction band. With conductor 44 coupled to voltage $V_1$, PN junction 59 is reverse-biased. A potential barrier shown by curve 72 exists to electrons 61 in layer 16 to flow to either P+ region 42 between reference lines 68 and 69 or to substrate 12 between reference lines 64 and 70. Electrons 61 are therefore held in N-type layer 16 and are able to pass below P+ region 42 without current flow to either region 42 or substrate 12.

FIG. 5 is a graph showing the energy level of electrons 77 and holes 76 in P+ region 42, layer 16 and substrate 12 along reference line 63 shown in FIG. 2. If conductor or electrode 44 is coupled to voltage $V_2$ through switch 45 shown in FIG. 1 and if the voltage $V_2$ is positive, a positive current will flow through conductive electrode 44 in the region 42 and forward-biased PN junction 59. The flow of positive current is shown in FIG. 5 by arrow 74. Arrow 74 shows the holes 76 will travel along the valance band shown by curve 75 in FIG. 5. The holes 76 will flow from region 42 through layer 16 into substrate 12. Electrons 77 will flow from layer 16 into P+ region 42 shown by arrow 78. Curve 79 shows the energy level of the conduction band $E_C$ along reference line 63. The flow of electrons across PN junction 59 results in scuppering, injecting, or removal of electrons 77 from N-type layer 16 to P+ region 42. The scuppering or current flow of electrons 77 is in consequence of the forward-biasing of PN junction 59. The current flow as illustrated by FIG. 5 corresponds to the behavior of a bipolar PNP transistor with the electrons in the charge coupled device channel 40 being injected into the P+ emitter or region 42 similar to a transistor base current. The holes 76 from the emitter or region 42 will be injected through channel 40 in layer 16 and collected by substrate 12. The electron current flow through resistor 80 shown by arrow 81 in FIG. 1 is an indication of the number of electrons 77 swept out or scuppered from channel 40. The current passing through resistor 80 provides a potential $V_3$ indicative of the amount of charge 77 scuppered out of channel 40.

PN junction 59 has a capacitance associated therewith and P+ region 42 has an ohmic resistance associated therewith between PN junction 59 and conductive electrode 44. This resistance and capacitance will provide an RC time constant to the signal in channel 40, electrons 77, if injected into region 42. If not injected, the electrons may be sequentially transferred from below electrodes 27 through 29 underneath region 42. The ohmic resistance of region 42 typically will be low since it is doped at the P+ level, therefore the RC time constant will be small.

The voltage or current on line 44 may be useful in providing a plurality of parallel output signals from charge coupled device 10 using a plurality of regions 42 such as shown in FIG. 1. Each may be positioned where signals are first transferred serially in a charge coupled device by means of electrodes such as electrodes 27 through 29 and then transferred in parallel by a region 42 over respective electrodes 44. In this manner a serial to parallel transfer may occur which is useful in certain signal processing applications. The above serial to parallel transfer technique is important especially in device applications where distances within the semiconductor device would be large so that the charge transfer by means of thermal diffusion within the semiconductor material in a channel would not be adequate to transfer the charge over the distance desired. In the output technique herein described, electrons in channel 40 as shown in FIG. 5 are immediately injected into the forward-biased emitter, region 42, and then transported through the P+ region to the desired location as majority carriers by way of a conductor.

In fabrication, the P+ emitter diffusion 42 can be put into layer 16 using a polysilicon oxide-aligned contact process. The polysilicon is defined using standard photolithic procedures. A 3000 Angstrom oxide layer 35 shown in FIG. 2 is thermally grown over the polysilicon such as electrodes 29 and 30. A photoresist mask is next photoengraved to cover electrodes 27 through 33 except leaving a portion of electrodes 29 and 30 along with oxide layer 35 exposed which will be used to define P+ region 42. Silicon nitride layer 22 is etched in the region between electrodes 29 and 30. Gate oxide 20 is etched in the region between electrodes 29 and 30 with a well controlled HF—H$_2$O solution. Only approximately 500 Angstroms of oxide, the thickness of layer 20, is removed when layer 20 is etched and therefore 2500 Angstroms of oxide 35 remains over polysilicon electrodes 29 and 30. P+ region 42 may be formed by ion implanting P-type dopants with the polysilicon electrodes 29 and 30 defining the area of implantation. The impurities implanted may be, for example, boron which may be annealed. A short 30-second etch is performed to remove any oxide in window 43 shown in FIG. 1. Conductive electrode 44 such as aluminum is deposited to make ohmic contact with P+ region 42. The conductive material is subsequently etched to delineate electrode 44.

Figures 6, 7:
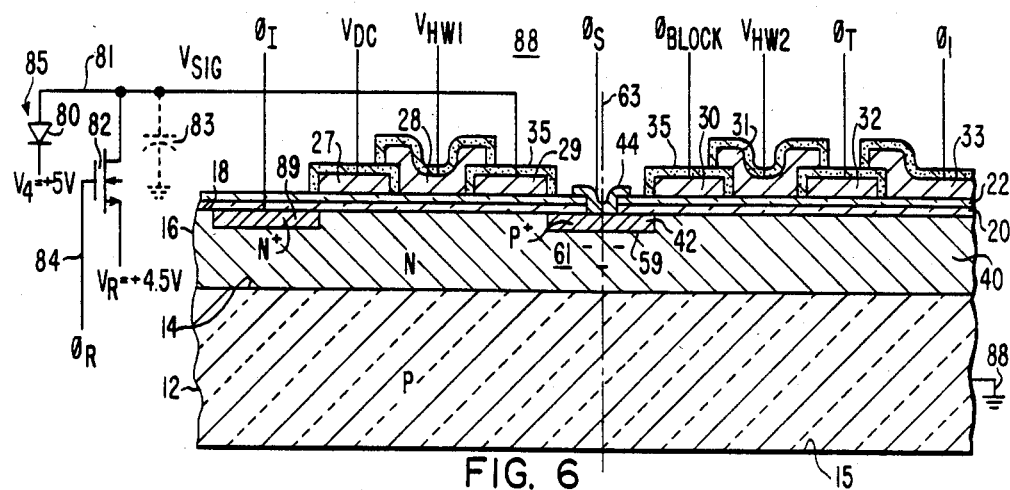
FIG. 6 is a schematic and cross-section view of an alternate embodiment of the invention.
FIG. 7 shows waveforms for operation of the embodiment in FIG. 6.

FIG. 6 is a schematic and cross-section view of an alternate embodiment of the invention. In FIG. 6, like references are used for functions corresponding to the apparatus of FIG. 2. FIG. 6 shows circuitry to provide charge equalibration by forward scuppering that cancels photodiode reset noise, reset hold-over charge and threshold voltage offsets. The embodiment of FIG. 6 may function as a peak detector for the signal on line 81.

In FIG. 6, a photodiode 80 is shown having its cathode coupled to voltage source $V_4$, which may, for example, be 5 volts and its anode coupled over line 81 to the drain of transistor 82 and to electrode 29. The capacitance on line 81 is represented by capacitor 83 coupled to ground potential. The gate of transistor 82 is coupled over line 84 to control signal $\phi_R$. The source of transistor 82 is coupled to voltage $V_R$ which may, for example, be 4.5 volts. As shown in FIG. 6, transistor 82 is an N channel field effect transistor. Radiant energy 85 is absorbed by photodiode 80 by the mechanism of generating hole electron pairs. The holes in photodiode 80 migrate to line 81 causing it to become more positive.

Charge coupled device 88 is similar to charge coupled device 10 shown in FIGS. 1 and 2 except electrode 27 is shown completely and an N+ region 89 has been added in upper surface 18 of N-type layer 16. N+ region 89 may be rectangular in shape as viewed from above surface 18 and positioned adjacent to one side of electrode 27. N+ region 89 is positioned between P regions 36 and 38 shown in FIG. 1. N+ region 89 is coupled to control signal $\phi_I$. Electrode 27 is coupled to voltage $V_{DC}$ which may be, for example, 4 volts. Electrode 28 is coupled to voltage $V_{HW1}$ which may be, for example, 6.5 volts. Electrode 29 is coupled to line 81 and carries the signal voltage from photodiode 80. Line 81 is reset by transistor 82 in response to control signal $\phi_R$. Region 42 is coupled to control signal $\phi_S$. Electrode 30 is coupled to control signal $\phi_{block}$. Electrode 31 is coupled to voltage $V_{HW2}$ which may, for example, be +8 volts. Electrode 32 is coupled to control signal $\phi_T$. Electrode 33 is coupled to control signal $\phi_1$.

FIG. 7 shows waveforms 7a through 7g for operation of the embodiment in FIG. 6. At time T1, control signal $\phi_R$ goes from zero volts to 10 volts causing transistor 82 to be conductive or on. Line 81 is charged to voltage $V_R$ which may be, for example, 4.5 volts. With line 81 charged to 4.5 volts, photodiode 80 is reverse biased by 0.5 volts since voltage $V_4$ may be, for example, at 5 volts. Also, at time T1, control signal $\phi_{block}$ is at +10 volts causing the potential in channel 40 below electrode 30 to be attractive and therefore to hold the charge that had passed from underneath electrode 28 to underneath electrodes 30 and 31 in channel 40. At time T2, control signal $\phi_T$ goes from zero to +10 volts causing the region in channel 40 below electrode 32 to be attractive to charge. At time T3, control signal $\phi_{block}$ goes from +10 volts to zero volts which tends to push the charge from underneath electrode 30 in channel 40 to underneath electrodes 31 and 32. At time T4, control signal $\phi_1$ goes from zero to 10 volts which attracts charge from underneath electrodes 31 and 32 in channel 40 to underneath electrode 33. At time T5, control signal $\phi_T$ goes from 10 to zero volts which tends to push the charge from underneath electrode 32 to underneath electrode 33. At time T6, control signal $\phi_1$ goes from +10 volts to zero volts which causes the charge underneath electrode 33 to be transferred along to another bit position of a shift register if electrode 33 is one electrode of a shift register. The transfer of charge at time T4 and T5 to underneath electrode 33 represents the data signal $V_{sig}$ from photodiode 80 of radiant energy 85 received by photodiode 80 during a time period prior to time T1. At time T1, photodiode 80 was reset to a reset voltage.

Figure 8:
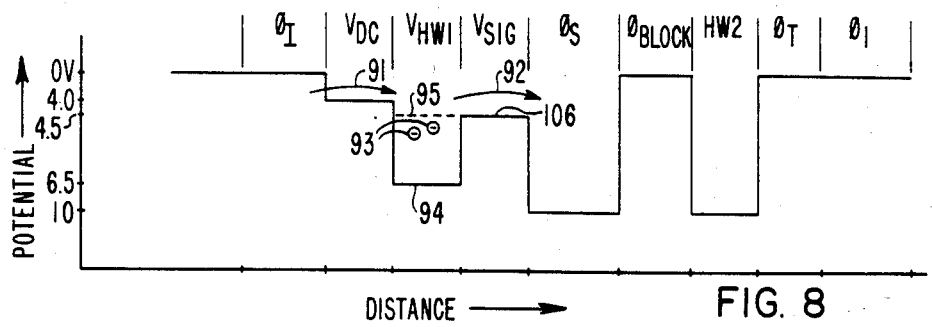
FIGS. 8 and 9 are graphs showing the potential of the electric field versus distance along the CCD channel of the embodiment of FIG. 6.
Figure 9:
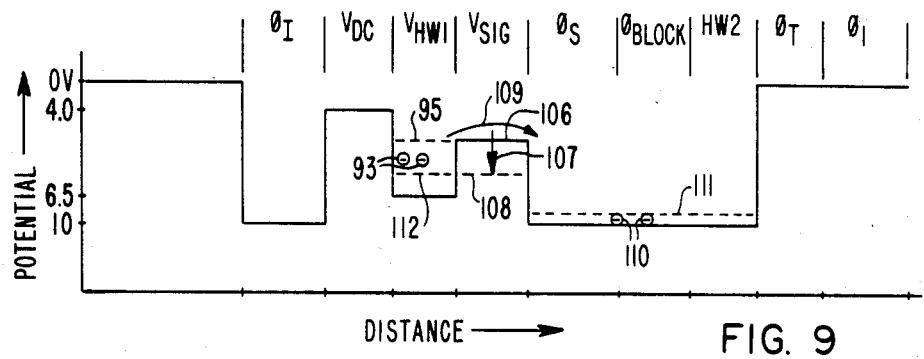

FIGS. 8 and 9 are graphs showing the potential of the electric field in channel 40 versus the distance along the channel from region 89 to underneath electrode 33 of the embodiment of FIG. 6. FIG. 8 shows the potential in channel 40 underneath electrode 29 at times voltage $V_{sig}$ is at the potential established by the reset transistor 82 of 4.5 volts. It is to be remembered that the more positive the electrode potentials become, the deeper or more attractive the potential lines will be in FIG. 8.

At time T7 shown in FIG. 7, control signal $\phi_I$ goes from 10 volts to zero volts causing N+ region 89 to inject electrons shown by arrow 91 in FIG. 8 in the channel 40 underneath electrodes 27, 28, 29 and underneath region 42 since the potential of the electrons are attracted underneath these electrodes. The electrons are stopped from going any further in channel 40 by the potential region under electrode 30 since control signal $\phi_{block}$ on electrode 30 is at zero volts.

At time T8, control signal $\phi_S$ goes from zero to 10 volts causing P+ region 42 to be forward-biased with respect to channel 40. P+ region 42, N layer 16 and P-type substrate 12 behave like a bipolar transistor with the electrons in channel 40 or layer 16 being injected into the P+ emitter region 42 similar to base current. The holes from the emitter or P+ region 42 will be injected through layer 16 or channel 40 and collected in substrate 12. Arrow 92 in FIG. 8 represents electrons in channel 40 being pulled over the potential barrier provided underneath electrode 29 to P region 42 which is termed forward scuppering since the charge is removed in the forward direction of the channel in the same direction that charge representative of data signals will be moved or transferred. Electrons 93 are shown underneath electrode 28 in a holding well between potential line segment 94 and dashed line 95 shown in FIG. 8. The potential in channel 40 at time T8 is shown in FIG. 8.

At T8A control signal $\phi_R$ goes from 10 volts to 0 volts causing transistor 82 to be non-conducting.

At time T9, control signal $\phi_I$ goes from zero to 10 volts causing N+ region 89 to be reverse-biased and preventing N+ region 89 from supplying any more electrons into N channel 40. Since control signal $\phi_S$ is still at +10 volts, charge underneath region 42 will be pulled into region 42 since it is forward-biased, therefore emptying the region below region 42 of electrons. At time T10, control signal $\phi_S$ goes from +10 volts to zero volts causing P+ region 42 to be no longer forward-biased with respect to layer 16 which is at ground potential.

The waveforms at time T7 through time T10 result in filling holding well 1, HW1, the region below electrode 28, with a predetermined amount of charge shown as electrons 93 between potential lines 94 and 95 shown in Figure 8. As will be subsequently explained, by filling holding well 1 with a known amount of charge at the time line 81 is reset by $\phi_R$, the amount of charge can be set to correspond to 64 decibels of light intensity preventing saturation of the charge coupled device 88 and subsequent signal processing circuitry.

The reset KTC, noise and also the hold-over charge on line 81 from the reset operation are cancelled by the embodiment shown in FIG. 6. The voltage on photodiode 80 after reset by control signal $\phi_R$ will be $V_R + V_N$ where $V_R$ is the reset voltage and $V_N$ the noise voltage. The amount of charge in the holding well 1 below electrode 28 just after time T10 will be as shown in equation 1.

$$Q_{initial} = (V_R + V_N - V_{HW1})C_{HW1} \tag{1}$$

In equation 1, $V_{HW1}$ represents the voltage of electrode 28 and $C_{HW1}$ represents the capacitance of the holding well 1 in channel 40.

At time T11, control signal $\phi_{block}$ goes from zero to 10 volts causing the region in channel 40 below electrode 30 to be attractive as shown in FIG. 9. The increase in voltage on line 81 from T8A corresponds to the hole-electron pairs generated in photodiode 80 from radiant energy 85. The holes collected by the anode of photodiode 80 will cause the voltage on line 81 to rise in potential as shown by waveform b, curve 105, in FIG. 7. As the potential of line 81 increases, the region below electrode 29 becomes more attractive to charge and thus the potential barrier as shown by line 106 in FIG. 9 moves in a direction shown by arrow 107 to a final potential shown by dashed line 108 just prior to time T12 when the voltage on line 81 is reset to 4.5 volts due to control signal $\phi_R$ going from zero to 10 volts.

Referring to FIG. 9, as the potential of $V_{sig}$ increases, the potential barrier below electrode 29 decreases causing electrons in holding well 1 below electrode 28 to flow over the pootential barrier shown by arrow 109 to the region below region 42 and electrodes 30 and 31. As the potential of electrode 29 increases, the potential barrier will decrease such as shown by dashed potential line 108 filling the region on the other side of potential barrier 108 with electrons 110 to a level shown by dashed potential line 111. From T8A to T10, control signal $\phi$ will be at 10 volts and charge 110 below region 42 will be injected into region 42. After T10, electrons 110 will remain below region 42.

The amount of charge in holding well 1 underneath electrode 28 after the signal $V_{sig}$ has been applied as shown by waveform b in FIG. 7, is given in equation 2.

$$Q_{signal} = (V_R + V_N - V_{sig} - V_{HW1})C_{HW1} \tag{2}$$

The amount of charge spilled forward over potential barrier 108 to underneath holding well 2 underneath electrode 31 is the difference between the initial charge $Q_{initial}$ given in equation 1 and $Q_{signal}$ given in equation 2. The charge in holding well 2, $Q_{HW2}$ is given by equation 3.

$$Q_{signal} - Q_{signal} = V_{sig}C_{HW1} \tag{3}$$

One can see that the threshold voltage $V_T$ of transistor 82 does not affect the amount of charge underneath holding well 2. $V_R$ in equations 1 and 2 may be written as $V_R + \Delta V_{TR}$ and $V_{HW1}$ in equations 1 and 2 may be written as $V_{HW1} + \Delta V_{THW1}$. By performing the subtraction between equations 1 and 2, the terms $\Delta V_{TR}$ and $\Delta V_{THW1}$ are eliminated. The only noise source for the circuit shown in FIG. 6 will be due to the KTC noise associated with the scuppering of charge by region 42, layer 16 and substrate 12 acting as a vertical PNP transistor. With respect to KTC noise, K refers to Boltzmann's constant, T refers to temperature in degrees Kelvin and C refers to capacitance in Farads. Only the capacitance of holding well 1 contributes to the KTC noise. The capacitance of the photodiode and signal gate do not contribute to KTC noise. A noise of 59e$^-$ is obtained where the active area of holding well 1 is 3 micrometers by 5 micrometers by 12 micrometers.

At time T12, control signal $\phi_R$ goes from zero to 10 volts which resets signal $V_{sig}$ to 4.5 volts which causes the potential barrier underneath electrode 29 to return to the level of line segment 106 in FIG. 9 which prevents any more electrons 93 from passing over potential barrier 106 since the charge in holding well 1 is now at the potential level of dashed line 112.

At time T13, control signal $\phi_T$ goes from zero to 10 volts causing the region underneath electrode 32 to be attractive to electrons 110 and collects electrons 110 underneath electrode 32. At time T14, control signal $\phi_{block}$ goes from +10 volts to zero volts causing the region underneath electrode 30 to be unattractive to charge. At time T15, control signal $\phi_1$ goes from zero to 10 volts causing the region under electrode 33 to be attractive to charge. At time T16, control signal $\phi_T$ goes from +10 volts to zero volts causing the region underneath electrode 32 to be unattractive to charge and pushing charge 110 underneath electrode 33. At time T17, control signal $\phi_1$ goes from +10 volts to zero volts causing the charge underneath electrode 33 to be transferred to a second bit (not shown) of the shift register or to some other utilization region. Times T18 through T22 correspond to repetition of times T7 through T11, respectively, with regard to waveforms a through g shown in FIG. 7 and the operation of the embodiment in FIG. 6.

Figure 10:
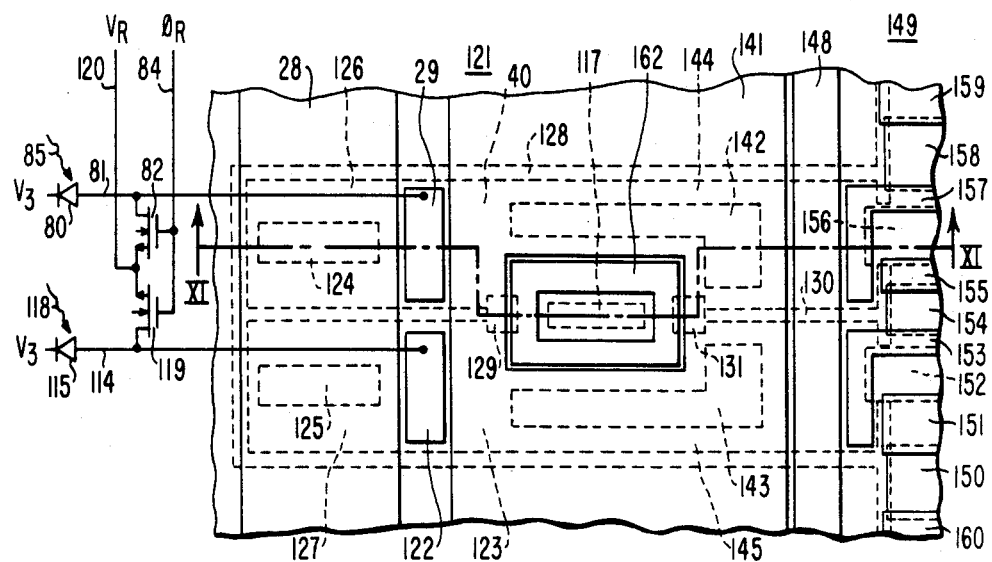
FIG. 10 is a schematic and plan view of an alternate embodiment of the invention.
Figure 11:
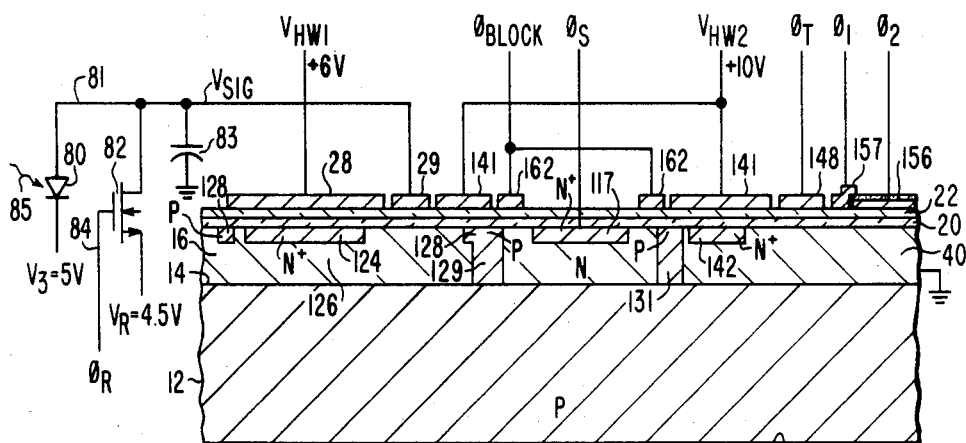
FIG. 11 is a schematic and cross-section view along the lines XI—XI of FIG. 10.

FIG. 10 is a schematic and plan view of an alternate embodiment of the invention. FIG. 11 is a schematic and cross-section view along the lines XI—XI of FIG. 10. The embodiment of FIG. 10 may function as a peak detector for the signals on lines 81 and 114 from photodiodes 80 and 115, respectively. In FIG. 10, N+ region 117 functions as a source of electrons at first times and as a sink for electrons at second times. N+ region 117 performs the functions of N+ region 89 in FIG. 6 and of P+ region 42 in FIG. 6. In FIG. 10 like references are used for functions corresponding to the apparatus of FIG. 6. Photodiodes 80 and 115 sense radiant energy 85 and 118 and provide a signal on lines 81 and 114, respectively. Transistors 82 and 119 have their source coupled to line 120 which is coupled to a potential suitable for resetting lines 81 and 114. The gate of transistors 82 and 119 are coupled to line 84 to control signal $\phi_R$. Line 81 is coupled to electrode 29 which overlies silicon nitride layer 22 and channel 40 of charge couple device 121. Line 114 is coupled to electrode 122 which overlies silicon nitride layer 22 and channel 123 of charge coupled device 121. Electrode 28 adjacent to electrode 29 and electrode 122 over channels 40 and 123, respectively, function to provide holding wells 126 and 127 in channels 40 and 123, respectively, thereunder. Electrode 28 may be at a potential of $V_{HW1}$. N+ regions 124 and 125 are conductive regions which increase the capacity of holding wells 126 and 127 for storing electrons. Channel 40 has outer limits defined by P+ region 128 which is coupled to substrate 12 by a deep diffusion 129. P region 128 also determines the outer limits of channel 123. P region 130 functions to determine the limit of channels 40 and 123. P region 130 is coupled to substrate 12 by deep diffusion of P-type material 131.

Electrode 141 overlies silicon nitride layer 22 and functions to provide holding wells 144 and 145 in channels 40 and 123, respectively, adjacent electrodes 29 and 122, respectively. N+ conductive regions 142 and 143 in the upper surface of N-type layer 16 function to increase the holding capacity of holding wells 144 and 145. Electrode 141 may be held at a potential of $V_{HW2}$ such as 10 volts. Electrode 148 which overlies silicon nitride layer 22 in channels 40 and 123 is adjacent to electrode 141 and functions to transfer charge from holding wells 144 and 145 to shift register 149 at selected times. Shift register 149 is comprised of a plurality of electrodes 150 through 160 to shift charge transferred to it from holding wells 144 and 145 to additional signal processing circuitry on the chip or to an output circuit for transferring signals in the shift register off the chip. Each bit position of shift register 149 may be of the four-phase type and have four corresponding electrodes such as 150 through 153 for one-bit position and 154 through 157 for a second bit position which is well known in the art. Additional electrodes 158 through 160 may, for example, be portions of additional bits of shift register 149.

Electrode 162 is positioned on silicon nitride layer 22 and completely surrounds N+ region 117 and is positioned between N+ region 117 and electrode 141. Electrode 162 is coupled to control signal $\phi_{block}$ and functions to provide an attractive region at times for coupling charge from holding wells 144 and 145 to N+ region 117 and at other times to provide an unattractive region or a potential barrier between holding wells 144 and 145 and N+ region 117.

Figure 12:
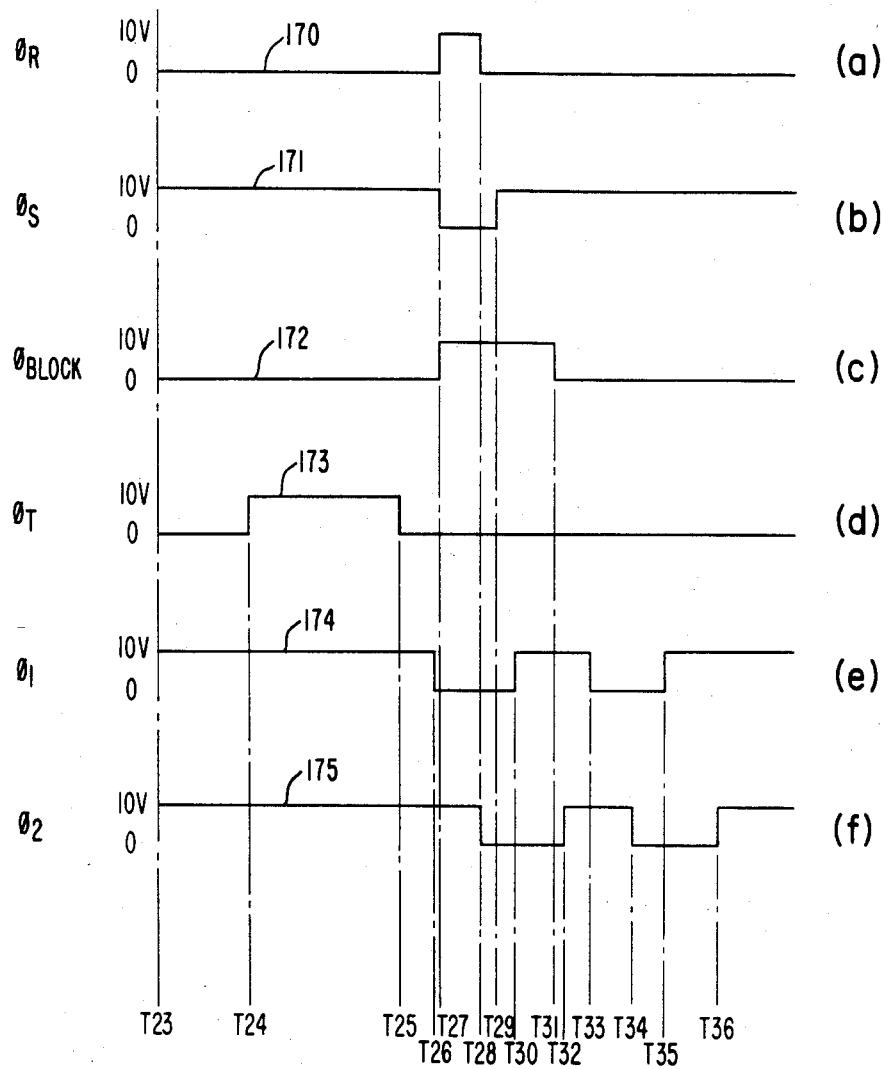
FIG. 12 shows waveforms for the operation of the embodiment in FIG. 10.

FIG. 12 shows waveforms a through f for the operation of the embodiment in FIG. 10. In FIG. 10 the abscissa represents time and the ordinate represents voltage. In operation of the embodiment in FIG. 10, at T23 radiant energy 85 is causing line 81 to become more positive which lowers the potential barrier underneath electrode 29. The potential barrier is represented by line segment 168 in FIG. 13. Arrow 169 shows that the potential barrier 168 is decreasing as electrode 29 becomes more positive. At T23, N+ region 117 is isolated from holding wells 144 and 145 by control signal $\phi_{block}$ shown by curve 172 in FIG. 12 which is at zero volts. The charge 176 that passes over potential barrier 168 such as, for example, in channel 40 is shown as charge 177, in the region of holding well 144 shown in FIG. 13. Arrow 178 shows the movement of charge over barrier 168 to holding well 144. At T24, control signal $\phi_T$ on electrode 148 goes from zero to +10 volts causing the region thereunder to be attractive to charge 177 in holding well 144. Line segment 179 shows the potential barrier underneath the electrode 148 in channel 40 at times $\phi_{block}$ is at zero volts and line segment 180 shows the attractive region or low potential barrier at times control signal $\phi_{block}$ is at 10 volts. Arrow 181 shows a flow of charge 177 to the attractive region shown by line segment 180. Since control signal $\phi_1$ is also at 10 volts, the region under electrode 157 is also attractive to charge shown by line segment 182 in FIG. 13.

Figure 13:
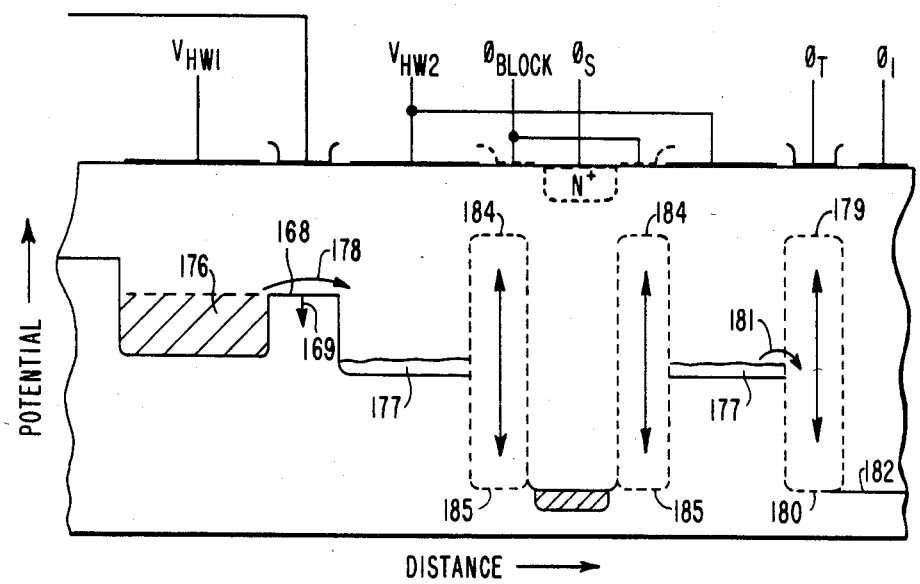
FIG. 13 is a graph showing the potential of the electric field versus distance along the CCD channel of the embodiment of FIG. 10.

At T25, control signal $\phi_T$ goes from +10 volts to zero volts causing the region underneath electrode 148 to be unattractive and have a potential shown by line segment 179 in FIG. 13. The charge underneath electrode 148 is therefore moved to below electrode 157 and 156 since control signals $\phi_1$ and $\phi_2$ shown by curves 174 and 175 in FIG. 12 are both at +10 volts.

At T26, control signal $\phi_1$ goes from 10 volts to zero volts shifting the charge under electrode 157 to under electrode 156.

At T27, $\phi_R$ goes from zero to 10 volts causing transistor 82 to be conducting and resetting electrode 29 to 4.5 volts. Also control signal $\phi_S$ goes from +10 volts to zero volts causing electrons to flow into channel 40. Also control signal $\phi_{block}$ goes from zero to +10 volts causing the potential barrier around N+ region 117 to drop from a previous high shown by line segments 184 to a low shown by line segments 185. The electrons in channel 40 pass over the potential barrier 168 underneath electrode 29 and into holding well 126. The electrons also had flowed into holding well 144 but are stopped at the region below electrode 148 since control signal $\phi_T$ is at zero volts.

At T28, control signal $\phi_R$ returns to zero volts allowing radiant energy 85 in conjunction with photodiode 80 to raise the potential of line 81 and electrode 29. Also at T28, control signal $\phi_2$ goes from +10 volts to zero volts which shifts the charge under electrode 156 to underneath electrode 157 shown in FIG. 10.

At T29, control signal $\phi_S$ goes from zero to 10 volts causing N+ region 117 to be attractive to charge drawing charge from potential well 126 over potential barrier 168 to N+ region 117. Also charge in holding well 144 is drawn to N+ region 117. At T29, N+ region 117 goes to 10 volts and acts as a sink for the electrons in channel 40. The drawing of charge from holding well 126 over potential barrier 168 is a forward scuppering action, leaving a residual charge in holding well 126 which is equal or below potential barrier 168 which is determined by the reset voltage $V_R$ on line 81.

At T30, control signal $\phi_1$ goes from zero to 10 volts to permit charge to be shifted in shift register 149 which is well known in the art.

At T31, control signal $\phi_{block}$ goes from 10 volts to zero volts causing a potential barrier to be around N+ region 117 at the level shown by line segments 184 in FIG. 13 thereby preventing any more electron charge to be drawn from holding wells 126 and 144 or holding wells 127 and 145 to N+ region 117.

At T32, control signal $\phi_2$ goes from zero to 10 volts causing charge to be shifted along shift register 149. At T33, control signal $\phi_1$ goes from +10 volts to zero volts causing charge to be shifted along in shift register 149. At T34, control signal $\phi_2$ goes from +10 volts to zero volts causing charge to be shifted in shift register 149. At time T35, control signal $\phi_1$ goes from zero to 10 volts causing charge to be shifted in shift register 149. At T36, control signal $\phi_2$ goes from zero to 10volts causing charge to be shifted along in shift register 149. Control signals $\phi_3$ and $\phi_4$ likewise pulse electrodes 158 and 159, respectively, or electrodes 154 and 155, respectively, for the transfer of charge in shift register 149.

As described with regard to FIGS. 10 through 13, N+ region 117 functions to supply electrons at first times to holding well 126 which electrons are able to cross potential barrier 168 at times electrode 29 is reset to the reset voltage and the electrons are swept back across the same barrier to N+ region 117, at other times to forward scupper the charge across barrier 168. Forward scuppering in channel 40 permits cancellation of sources of noise and the use of region 117 to supply electrons at one time and to attract electrons at other times allows for reducing the physical size of the charge coupled device.

Apparatus has been described for use in a charge coupled device for removing charge from its channel at selected times and for permitting charge to be transferred past or through the apparatus at other times. A P+ region is spaced by a predetermined distance from a P-type substrate with an N-type channel therebetween. PNP transistor action occurs at times the P+ region is forward biased, thereby drawing the charge electrons out of the channel by their ejection into the P+ region. At times when the P+ region to N channel junction is reverse-biased, the charge in the channel is permitted to flow undisturbed below the P+ region.

I claim:

1. Apparatus for removing charge from a charge coupled device at selected times comprising:
   a substrate of P-type semiconductor material,
   a layer of N-type semiconductor material above said substrate,
   a layer of insulation over said layer of semiconductor material,
   a plurality of electrodes positioned on said insulation layer adjacent one another for controlling said charge in said N-type layer,
   a first P-type region formed in said N-type layer positioned between two of said pluralities of electrodes,
   first means for applying a reverse bias potential to said first P-type region with respect to said N-type layer at first times and for applying a forward bias at second times where upon charge in said N-type layer is removed.

2. The apparatus of claim 1 wherein said substrate forms the collector of a PNP bipolar transistor at times said P-type region is forward biased.

3. The apparatus of claim 1 wherein said N-type layer forms the base of a PNP bipolar transistor at times said P-type region is forward biased.

4. The apparatus of claim 1 wherein said P-type region forms the emitter of a PNP transistor at times said P-type region is forward biased.

5. The apparatus of claim 1 wherein the distance between said substrate and said P-type region is the basewidth of a PNP transistor at times said P-type region is forward biased.

6. The apparatus of claim 1 wherein said N-type layer includes second and third P+ regions running longitudinally along each side of a path for said charge underneath said plurality of electrodes to function as channel stoppers,
   said first P region is spaced by a predetermined distance from said second and third regions,
   said means for applying a reverse bias potential includes a potential sufficient to completely deplete the region in said N-type layer between said P region and said second P+ region and between said first P region and said third P+ region.

7. The apparatus of claim 6 wherein said potential is adjusted to provide in said depleted region in said N-type layer between said first P region and said second P+ region and between said first P region and said third P+ region,
- a potential minimum that is more repulsive than the most attractive state of the potential minimum in said N-type layer below said two of said plurality of electrodes to assure charge below and on either side of said first P region will be transported to the region below the respective electrode when the potential minimum is most attractive.

8. The apparatus of claim 1 wherein said N-type layer includes second and third P+ regions running longitudinally along each side of a path for said charge underneath said plurality of electrodes to function as channel stoppers,
- said first P region is spaced by a predetermined distance from said second and third regions,
- said first means for applying a reverse bias potential includes a potential insufficient to deplete the region in said N-type layer between said first P region and said second P+ region and between said first P region and said third P+ region.

9. The apparatus of claim 8 further including second means for applying a potential to one of said electrodes adjacent said P region to cause the potential minimum beneath said electrode to be between the most attractive and most repulsive potential of the electrode adjacent said one electrode.

10. Apparatus for removing charge from a charge coupled device at selected times comprising:
- a substrate of P-type semiconductor material,
- a layer of N-type semiconductor material above said substrate,
- a layer of insulation over said layer of semiconductor material,
- a plurality of electrodes positioned on said insulation layer adjacent one another for controlling said charge in said N-type layer,
- a first P-type region formed in said N-type layer positioned below said exterior one of said electrodes,
- first means for applying a reverse bias potential to said first P-type region with respect to said N-type layer at first times and for applying a forward bias at second times where upon charge in said N-type layer is removed.

11. Apparatus for removing charge from the channel of a charge coupled device at selected times comprising:
- a substrate of P-type semiconductor material,
- a layer of N-type semiconductor material deposited thereover,
- a layer of insulation over said layer of semiconductor material,
- a plurality of electrodes positioned on said oxide layer adjacent one another,
- one of said electrode having an opening intermediate its ends,
- a P-type region formed in said N-type layer below said opening in said electrode,
- means for applying a reverse bias potential to said P-type region at first times and for applying a forward bias at second times.

12. A charge coupled device comprising:
- a semiconductor substrate of a first conductivity type,
- a first layer of semiconductor material over said semiconductor substrate of a second conductivity type,
- first and second spaced apart regions in said first layer of semiconductor material, said first region of said second type and said second region of said first type,
- a first layer of insulation over said first layer of semiconductor material,
- at least first through third electrodes adjacent one another over said first layer of insulation extending from said first region to said second region with said first electrode adjacent said first region and said third electrode adjacent said second region,
- said first electrode adapted for applying a potential to provide a first potential barrier in said first layer,
- said second electrode adapted for applying a potential to provide a holding well in said first layer,
- said third electrode adapted for applying at first times a potential indicative of no signal and at second times a potential indicative of a signal to provide second and third potential barriers respectively in said first layer underneath said third electrode,
- said first region adapted for applying a control signal for injecting charge in said first layer at first times over said first potential barrier into said holding well and over said second potential barrier to underneath said second region to provide a predetermined amount of charge in said holding well,
- said second region adapted for applying at first times a control signal to forward bias the junction between said second region and said first layer whereby charge in said first layer underneath said second region is removed by injection into said second region.

13. The charge coupled device of claim 12 wherein said first conductivity type is P.

14. The charge coupled device of claim 12 wherein said second conductivity type is N.

15. The charge coupled device of claim 12 wherein said semiconductor substrate forms the collector of a bipolar transistor at times said second region is forward biased.

16. The charge coupled device of claim 12 wherein said first layer forms the base of a bipolar transistor at times said second region is forward biased.

17. The charge coupled device of claim 12 wherein said second region is P type and forms the emitter of a PNP transistor at times said second region is forward biased.

18. The charge coupled device of claim 12 wherein said second region is P type and wherein the distance between said semiconductor substrate and said second region is the base width of a PNP transistor at times said second region is forward biased.

19. The charge coupled device of claim 12 further including:
- at least a fourth electrode over said first layer of insulation adjacent said second region,
- said fourth electrode adapted for applying a control signal to provide an attractive region for charge at third times and a potential barrier at fourth times in said first layer,
- and wherein the charge in said first layer underneath said second region at second times is from the charge in the holding well between said second and third potential barriers indicative of said signal.

20. The charge coupled device of claim 12 further including:
- at least fourth through sixth electrodes adjacent one another over said first layer of insulation extending from said second region with said fourth electrode adjacent said second region,
- said fourth electrode adapted for applying a control signal to provide an attractive region for charge at third times and a potential barrier at fourth times in said first layer, said fifth electrode adapted for applying a potential to provide a second holding well in said first layer, said sixth electrode adapted for applying a control signal to provide an attractive region for charge at fifth times and a potential barrier at sixth times in said first layer.

21. A charge coupled device comprising:

a semiconductor layer of a first type, a first region of a first type of higher concentration formed in said layer, a first layer of insulation over said layer, first and second electrodes spaced apart on said first layer and adapted for applying a potential to each said electrode to provide a first and second holding wells in said layer, a third electrode positioned between and adjacent said first and second electrodes and adapted for applying at first times a potential indicative of no signal to form a first potential barrier in said layer and at second times a signal to provide a second potential barrier in said layer, a fourth electrode positioned between and adjacent said second electrode and said first region and adapted for applying a control signal to provide an attractive region for charge thereunder at third times and a third potential barrier at fourth times in said layer, said first region adapted for applying a control signal for injecting charge during said third times into said second holding well and over said first potential barrier into said first holding well and for subsequently removing charge during said third times from said second holding well and from over said first potential barrier from said first holding well to leave a predetermined amount of charge in said first holding well and to leave said second holding well substantially empty.

22. The charge coupled device of claim 21, further including a substrate of semiconductor material of a second conductivity type supporting said semiconductor layer.

23. The charge coupled device of claim 21 wherein said semiconductor layer is n type.

24. The charge coupled device of claim 21 wherein said first region is positioned interior of said second electrode.

25. The charge coupled device of claim 22 wherein said fourth electrode follows a path around said first region.

* * * * *